United States Patent [19]

Nakagawa et al.

[11] Patent Number: 5,305,005
[45] Date of Patent: Apr. 19, 1994

[54] ANALOG TO DIGITAL CONVERTER SYSTEM

[75] Inventors: Shiro Nakagawa, Chiba; Atsuko Tsuchida, Saitama; Eiji Takahashi, Chiba, all of Japan

[73] Assignee: TDK Corporation, Tokyo, Japan

[21] Appl. No.: 897,152

[22] Filed: Jun. 11, 1992

[30] Foreign Application Priority Data

Jun. 27, 1991 [JP] Japan ............................... 3-181623
Sep. 27, 1991 [JP] Japan ............................... 3-275047

[51] Int. Cl.$^5$ ............................................ H03M 1/20
[52] U.S. Cl. ........................................ 341/131; 341/166
[58] Field of Search .............................. 341/131, 166

[56] References Cited

U.S. PATENT DOCUMENTS

| 4,144,577 | 3/1979 | Ley | 364/571 |
| 4,417,234 | 11/1983 | McKenna | 341/131 |
| 4,700,173 | 10/1987 | Araki et al. | 341/131 |
| 4,751,496 | 6/1988 | Araki et al. | 341/131 |
| 4,764,748 | 8/1988 | Geen et al. | 341/131 |
| 4,812,846 | 3/1989 | Noro | 341/131 |
| 5,073,778 | 12/1991 | Ueki et al. | 341/131 |
| 5,075,678 | 12/1991 | Ohlsson et al. | 341/131 |

Primary Examiner—Marc S. Hoff
Attorney, Agent, or Firm—Nikaido, Marmelstein, Murray & Oram

[57] ABSTRACT

An A/D converter system has an A/D converter element (10) which provides a first predetermined number of digital output bits for each input analog signal. An addition device (12,70) adds linear slope potential to the input analog signal. A calculator (14) provides an average of a plurality of digital output signals of the A/D converter element so that the average has larger number of bits than the first predetermined number. The addition device is implemented by a time constant circuit (70) which functions as an integral circuit for an input analog signal, and functions as a differential circuit for a slope potential.

7 Claims, 5 Drawing Sheets

ANALOG TO DIGITAL CONVERTER SYSTEM

FIELD OF THE INVENTION

The present invention relates to an analog to digital converter (A/D converter) for converting analog input signals to digital form, in particular, relates to such a converter which provides precise digital output signals with a simple structure of a converter.

BACKGROUND OF THE INVENTION

Conventionally, an integral type converter and a successive comparison type converter have been known as an A/D converter.

An integral type converter counts a number of clock signals which have a predetermined period, and integrates the clock signal to generate a slope voltage so that the counting operation stops just when a slope voltage exceeds the input analog potential. The digital output is the content of the counter when the counting operation stops.

A successive comparison type converter counts a number of clock signals which have a predetermined period. The content of the counter is converted to analog form, which is compared with input signal. When the converted analog signal becomes equal to the input analog signal, the counter stops, and the output of the converted digital signal is the content of the counter just when the counter stops. This type of converter is used in an A/D converter included in a micro-computer chip.

The accuracy of an A/D converter depends upon a number of bit positions of a counter and a D/A converter. As for an A/D converter included in a 4-bits micro-computer chip, a counter and a D/A converter have 8 bit positions. The resolving power or the minimum spacing of measure in this case is 0.4% (=1/256). When temperature, and/or relative humidity is displayed in digital form with an accuracy of 0.1° C. and/or 0.1%, an A/D converter must have the resolving power of at least 0.1% (=1/1000).

Therefore, a prior 8 bits A/D converter is not enough for displaying temperature and/or relative humidity with an accuracy of 0.1° C. and/or 0.1%.

The increase of the bit of a counter and a D/A converter is not desirable for improving the resolving power, because it would increase the production cost of an apparatus.

SUMMARY OF THE INVENTION

It is an object of the present invention to overcome the disadvantages and limitations of a prior A/D converter by providing a new and improved A/D converter.

It is also an object of the present invention to provide an A/D converter which has the higher resolving power than that defined by a number of bits of a counter and a D/A converter.

The above and other objects are attained by an A/D converter system comprising; an A/D converter element (10) which provides a digital output signal having a first predetermined number of bits for an input analog signal; linear potential device for providing potential which changes linearly; addition device (12, 70) for adding an output of the linear potential means to an input analog signal relatively to reference potential of the A/D converter element; amplitude of the slope potential being essentially equal to the minimum resolution of the A/D converter element; a calculator (14) for providing an average of a plurality of digital output signals of the A/D converter element with accuracy of second predetermined bits; wherein the second predetermined number is larger than the first predetermined number.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF PREFERRED EMBODIMENTS

Figure 1:
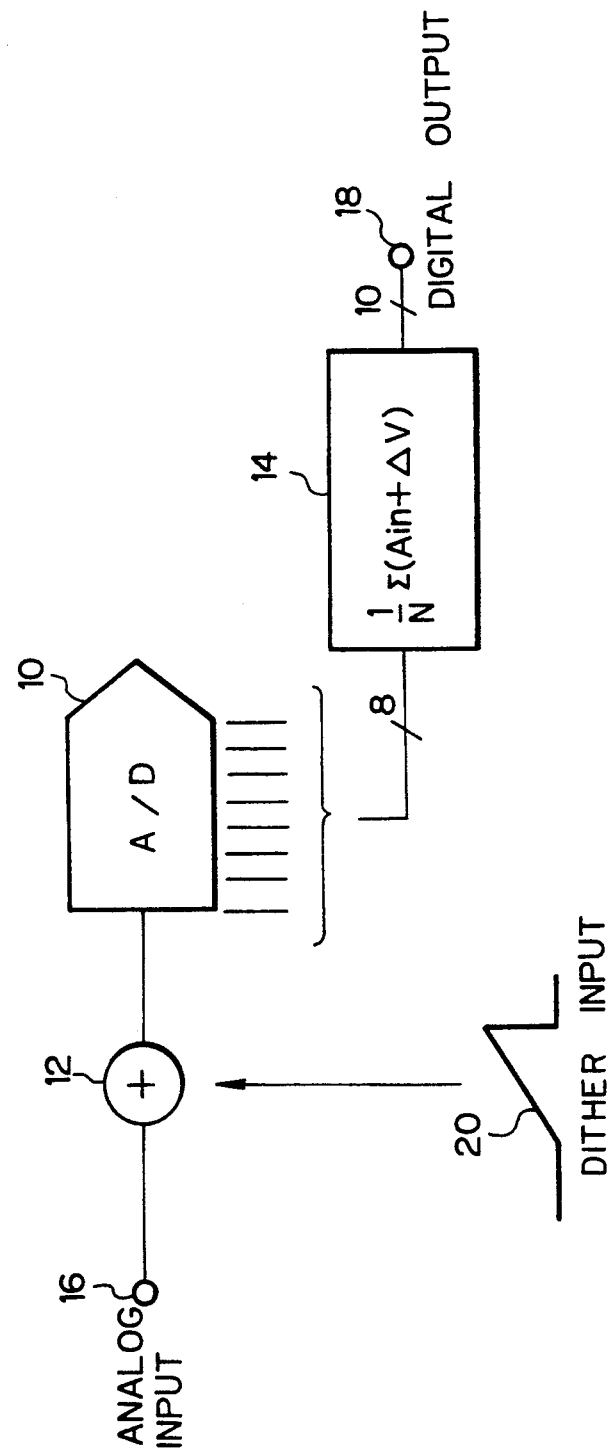
FIG. 1 is a block diagram of an A/D converter according to the present invention.

FIG. 1 shows a block diagram of A/D converter according to the present invention. FIG. 1 shows an A/D converter element 10, which provides a digital output of the accuracy of 8 bits, an adder 12, a calculator 14, an input terminal 16 for an analog signal $A_{in}$ in which is to be converted to digital form, a digital output terminal 18 which provides 10 bits of digital signal, and input terminal 20 of wobbling signal or dither signal, which is preferably a saw-tooth wave signal or a triangular signal, having an amplitude equal to the minimum resolution value (for instance 10 mV) of the A/D converter element 10.

The analog input signal at the input terminal 16 and the wobbling input signal 20 are added in the adder 12, and the sum is converted to digital form by the A/D converter element 10 with the accuracy of 8 bits. The A/D conversion in the A/D converter element 10 is carried out by plurality of times (N times) during the slope time of the wobbling signal, and the digital output signals in each A/D conversion operation are accumulated in the calculator 14. After the N-times of A/D conversion operation, the accumulated sum is divided by the number N in the calculator 14, which provides the quotient to the output terminal 18 with the accuracy of 10 bits. The preferable value of N is 16 in the embodiment. It should be noted that the calculator 14 provides the average value of 16 outputs of the A/D converter element 10.

When the instantaneous value of the wobbling signal 20 is $\Delta V$, the input value of the A/D converter element 10 is $A_{in} + \Delta V$, where the value $\Delta V$ increases (or decreases) according to the slope of the wobbling signal.

It is assumed, in the N number of digital output signals each having 8 bits, that m number of digital outputs are equal to $(A_{in})_{A/D}$ which is the digital output for an input analog signal $A_{in}$, and N−m number of digital outputs are equal to $(A_{in})_{A/D}+1$. The value N−m depends upon the relations of $A_{in}-(A_{in})_{A/D}$ and the minimum resolution of the A/D converter element. For instance, supposing that the minimum resolution is 10 mV, and $A_{in} - (A_{in})_{A/D}$ is 7 mV, the digital output increases by one when $\Delta V > 3$ mV. Also, if $A_{in} - (A_{in})_{A/D}$ is 3 mV, the digital output increases by one when $\Delta V > 7$ mV.

It should be noted therefore that the number N-m that the digital output is $(A_{in})_{A/D} + 1$ is proportional to $A_{in - (Ain)_{A/D}}$. The value $(N-m)/N$ is equal to the digital form of $A_{in - (Ain)_{A/D}}$ with the accuracy of $\log_2 N$ bits.

Therefore, when the A/D conversion is carried out for an analog signal which is sum of $A_{in}$ and a sloped wobbling signal by 16 times with the accuracy of 8 bits, and averaging the 16 digital signals by dividing the accumulation of 16 digital signals by 16 to provide the quotient with the accuracy of 10 bits, the A/D conversion output with the accuracy of 10 bits is obtained.

The number of the digital conversion operations (which is 16 in the embodiment) is $2^k$, where k is the number of figures of increase. Usually, the number k is in the range of 2 and 4, considering the linearity of the wobbling signal, and undesirable noise.

It should be noted that the output digital signal would be shifted by some value because of the addition of the wobbling signal in the input side. In order to solve that problem, it would be preferable either to decrease a predetermined value from the digital output signal, or to use a wobbling signal of both polarity changing from negative value to positive value through zero level.

Figure 2:
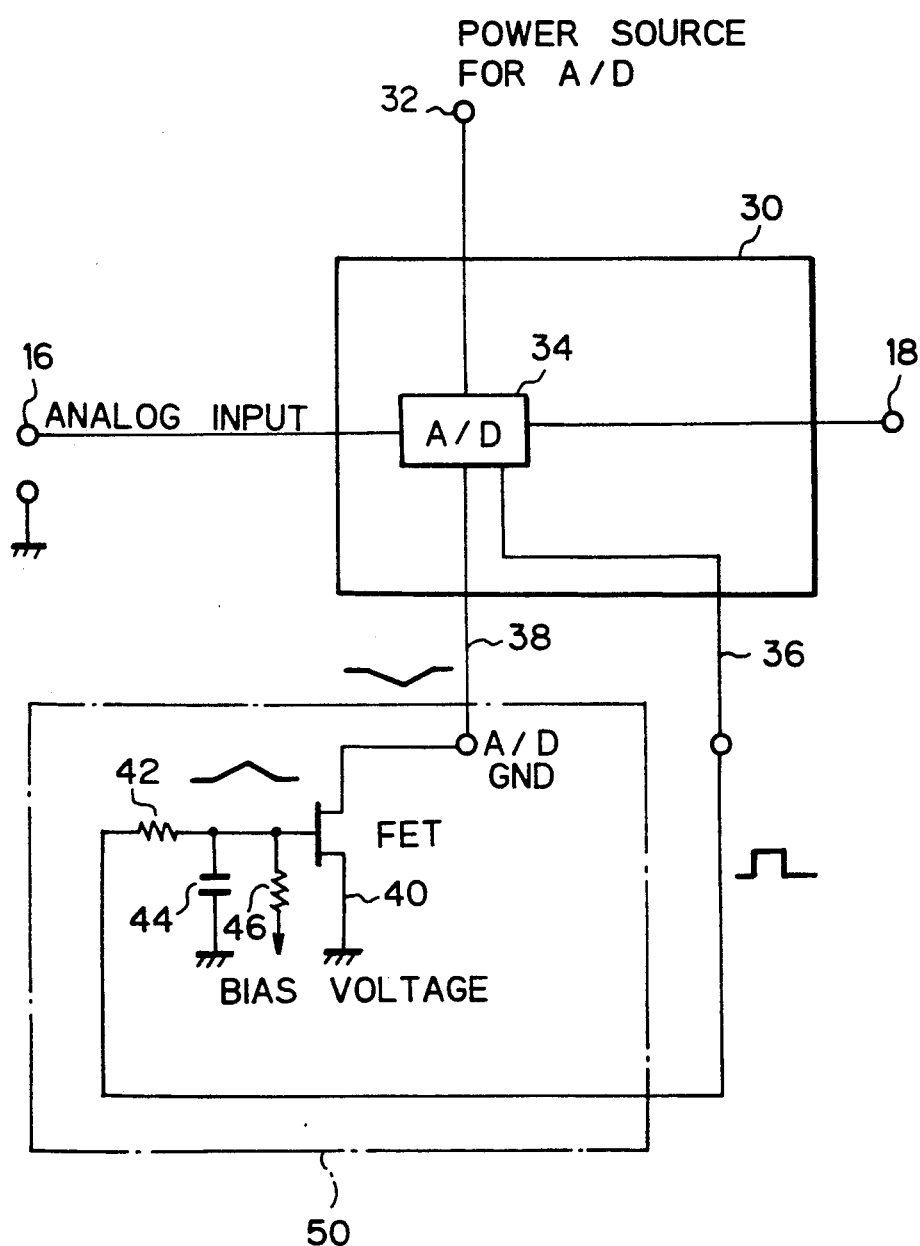
FIG. 2 is a block diagram of another embodiment of an A/D converter according to the present invention.

FIG. 2 shows another embodiment of the present invention. The features of FIG. 2 are that a commercial micro-computer 30 which mounts an A/D converter element 34 is used as an A/D converter element, and that a wobbling signal is added to a reference level of the A/D converter element instead of adding to an input analog signal. As the reference level of the A/D converter element is ground level, the ground level of the A/D converter element is modified with the wobbling signal in this case. The numeral 32 is a power terminal of the A/D converter element 34, 38 is a ground terminal of the A/D converter element 34, and 36 is a pulse output signal which shows the actual operation of the A/D conversion element 34.

The numeral 50 shows a wobbling circuit which provides the sloped wobbling signal based upon the pulse output signal at the terminal 36. The wobbling circuit 50 has an FET transistor 40, resistors 42 and 46, and a capacitor 44. The resistor 46 is coupled with a bias power supply (not shown). The resistor 42 and the capacitor 44 provide an integral circuit which provides the sloped potential according to the rectangular pulse signal at the terminal 36. The rectantular pulse signal is supplied by a micro-computer chip 30 during an A/D converter element 34 operates actually. The calculator 14 in FIG. 1 is implemented by programming a computer in the embodiment of FIG. 2.

In FIG. 2, the sloped potential is applied to the terminal 38 so that the reference potential of the A/D converter element 34 is modified according to the sloped wobbling signal. Therefore, it should be appreciated that the embodiment of FIG. 2 operates similarly to that of FIG. 1.

Figure 3:
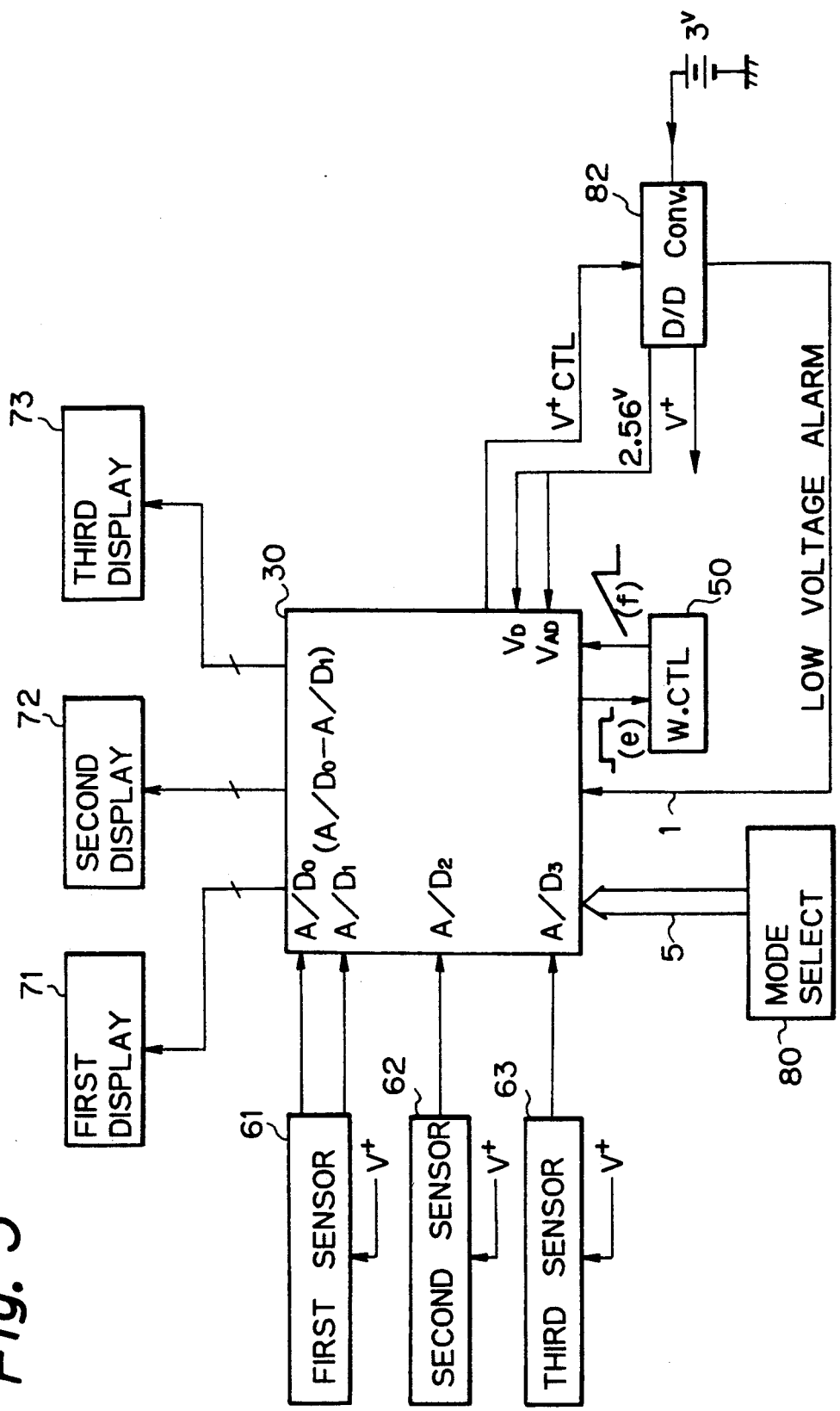
FIG. 3 is a block diagram of still another embodiment of an A/D converter according to the present invention.

FIG. 3 shows another embodiment of the present invention. The feature of FIG. 3 is that a micro-computer 30 is coupled with a plurality of sensors 61, 62 and 63, which are for instance a temperature meter and a humidity meter, providing an analog signal. The micro-computer 30 carries out the A/D conversion for those analog signals and the digital output signals are displayed on a plurality of liquid crystal display screens 71, 72 and 73 in decimal form. The numeral 50 in FIG. 3 is the wobbling circuit which is the same as 50 in FIG. 2. The numeral 80 is a mode selector which instructs the micro-computer 30 the A/D conversion operation, and 82 is a power supply circuit which provides the operational power supply to the micro-computer 30 by using the DC battery supply of 3V.

The first sensor 61 is for instance a temperature meter. The positive value of the temperature is converted to a digital form by a first A/D converter A/D$_0$, and the negative value of the same is converted by a second A/D converter A/D$_1$, and the difference (A/D$_0$ − A/D$_1$) is applied to a first display screen 71. The second sensor 62 is for instance a humidity meter, and the analog output of the second sensor is converted to a digital form by the A/D converter A/D$_2$ and the digital signal is applied to the second display screen 72. Similarly, the third sensor 63 is displayed on the third display screen 73.

Figure 4:
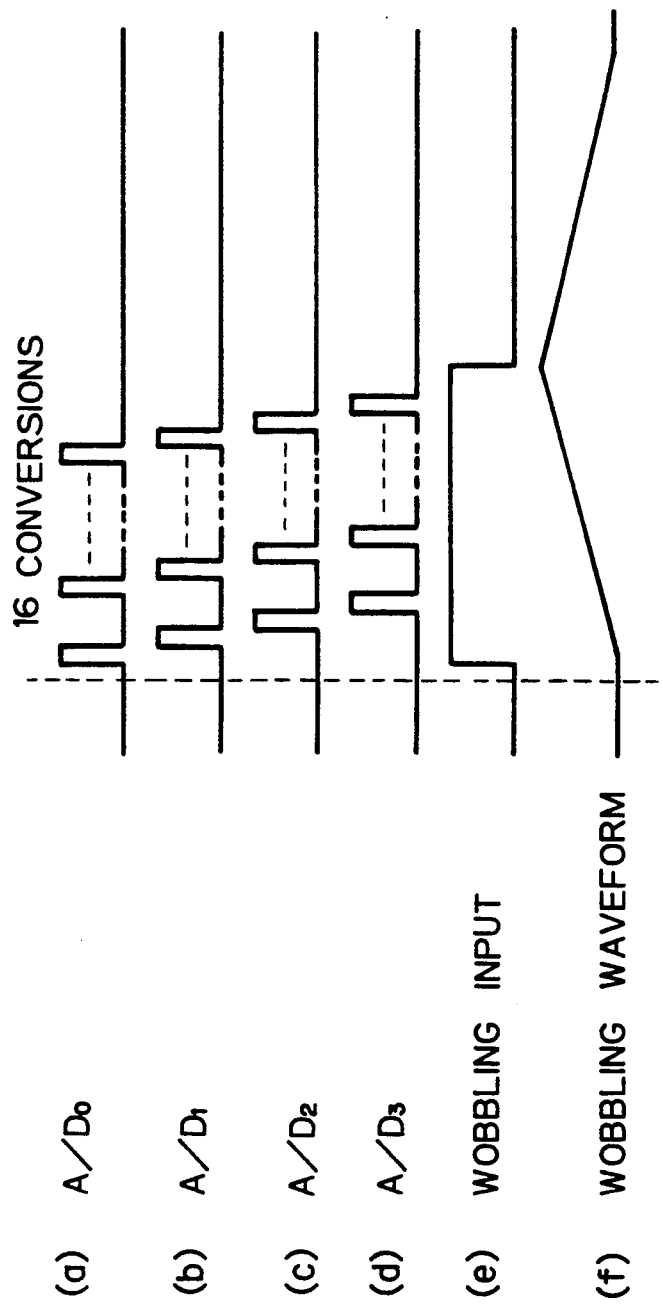
FIG. 4 shows operational waveform of FIG. 3.

FIG. 4 shows the operational waveforms of FIG. 3. In FIG. 4, the waveforms (a), (b), (c) and (d) show the digital output signals of each A/D converter elements each providing 16 digital signals in each operational period, the waveform (e) is a rectangular pulse signal showing the actual operation of the A/D converter elements, and the waveform (f) is the wobbling signal which is obtained by the integral of the rectangular pulse (e).

Although the embodiments describe the case that an 8 bit A/D converter elements provides a digital output signal with the accuracy of 10 bits, the present invention is applicable to the case that a low resolving power A/D converter element provides a higher resolving power digital output signal.

The present invention is useful in particular to display a digital signal with the accuracy of 0.1% which is usual in daily life by using a commercial 4 bits micro-computer.

Next, an adder for adding a wobbling signal to an input analog signal, or a reference potential of an A/D converter is considered.

An adder has to satisfy the following conditions.
a) The presence of an adder does not influence an input analog signal.
b) It has preferably infinite impedance to an input analog signal.
c) It does not introduce undesirable noise.
d) No power is consumed in an adder.
e) An adder must be as simple as possible in structure.

A conventional adder, like a ladder resistor type, or a combination of a ladder resistor and an operational amplifier is not preferable, since the former has resistors for the input of an analog signal and a wobbling signal so that the resistors decrease the input level of both the signals, and the latter has the problem of noise, temperature drift, and/or offset of an operational amplifier which also consumes some power.

Figure 5:
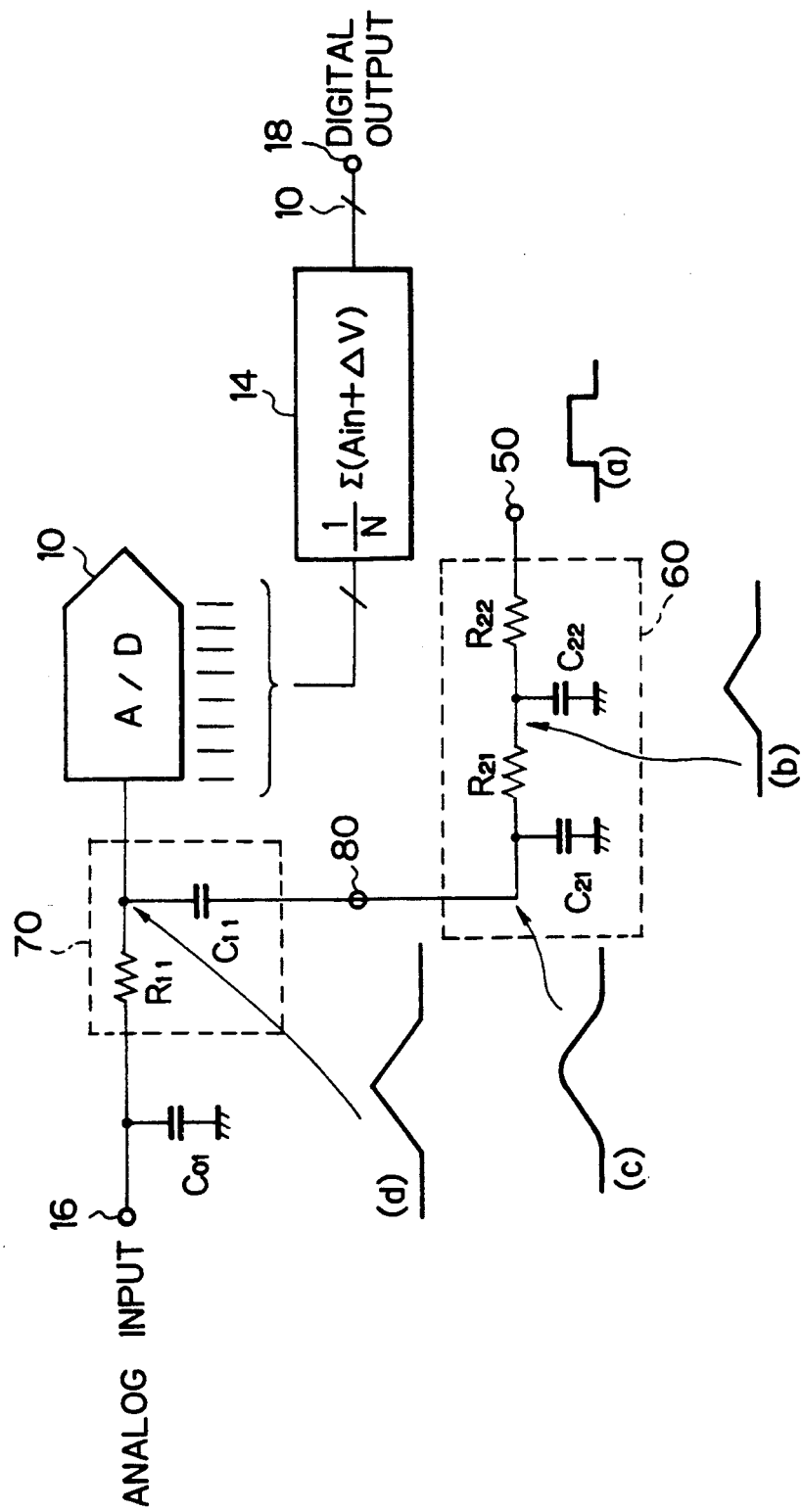
FIG. 5 is a block diagram of still another embodiment of an A/D converter according to the present invention.

FIG. 5 shows still another embodiment of the present invention, and the feature of FIG. 5 resides in an adder 70 which adds a wobbling signal to an input analog signal. In FIG. 5, the same numerals as those in FIG. 1 show the same members.

In FIG. 5, a capacitor $C_{01}$ is coupled between an analog input terminal 16 and ground. The input terminal 16 is coupled with an input of the A/D converter element 10 through the resistor $R_{11}$. The capacitor $C_{11}$ is coupled between the input of the A/D converter element 10 and the integral circuit 60 which has resistors $R_{21}$, $R_{22}$ and capacitors $C_{21}, C_{22}$. The input terminal 50 of the integral circuit 60 receives the rectangular waveform (a), which is supplied for instance by a micro-computer chip.

The resistor $R_{11}$ and the capacitor $C_{11}$ constitute an integral circuit 70 which integrates input analog signal at the input terminal 16.

The capacitor $C_{01}$ functions so that the impedance of the analog signal circuit of the input signal does not fluctuate the time constant of the integral circuit 70.

The input terminal 50 of the integral circuit 60 receives a rectangular pulse signal (a) which is called a diza signal. The integral circuit 60 is a double integral circuit. The first output (b) of the first integration is a triangular wave as shown in the waveform (b), and the second output of the second integration is shown in the waveform (c).

The waveform (c) which is the output of the second integration is applied to the input of the A/D converter element 10 through the capacitor $C_{11}$ of the integral circuit 70. It should be appreciated that the circuit 70 operates as an integral circuit for the input analog signal at the terminal 16, and simultaneously, operates as a differentiation circuit for the waveform (c) at the terminal 80. Therefore, the wobbling signal (waveform (d)) at the input of the A/D converter element 10 is the same as the waveform (b) which is triangular waveform. It should be noted that the rectangular waveform (a) is converted to the triangular waveform (d) through a double integral circuit 60 and a differentiation circuit 70.

The preferable numeral values for the capacitors and the resistors are as follows.

$C_{01} = 1 \mu F$
$C_{11} = 0.1 \mu F$
$C_{21} = 0.47 \mu F$
$R_{11} = 100 K\Omega$
$R_{21} = 510 K\Omega$
$R_{22} = 1 M\Omega$ Assuming that the duty ratio of the rectangular waveform (a) is 50%, the average level of the triangular signal (d) is zero for an A/D input signal, therefore, no initiation of an A/D converter for a wobbling signal is necessary.

It should be noted that a time constant circuit 70 (an integral circuit and/or a differentiation circuit) is usually mounted in a commercial A/D converter. Therefore, only one circuit which must have in the present invention is an integral circuit 60, which is low in price, and has no power consumption as it is a passive circuit.

The time constant circuit 70 functions as an integral circuit for an input analog signal so that it absorbs noise component. Simultaneously, the time constant circuit 70 functions as a differentiation circuit for a wobbling circuit so that the circuit for introducing the wobbling signal has high impedance for an input analog signal, and does not influence to an input analog signal.

When the circuit of FIG. 5 handles a plurality of analog signals, a single integral circuit 60 is provided common to all the analog signals, and the output of the integral circuit 60 is applied to each input terminal 80 of a time constant circuit 70 of each A/D converter element.

It should be noted that if the input waveform (a) is not rectangular signal, but triangular signal, the integral circuit 60 is not a double integral circuit, but a single integral circuit having a single resistor and a single capacitor is used.

From the foregoing it will now be apparent that a new and improved A/D converter has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An A/D converter system comprising:
    an A/D converter element which provides a digital output signal having a first predetermined number of bits for an input analog signal;
    linear potential muans for providing potential which changes linearly;
    addition means for adding an output of said linear potential means to an output analog signal relatively to a reference potential of said A/D converter element wherein said addition means is a time constant circuit which operates as an integrator for an analog input signal, and operates as a differential circuit for slope potential,
    amplitude of said slope potential being essentially equal to a minimum resolution of said A/D converter element; and
    a calculator for providing an average of a plurality of digital output signals of said A/D converter element with accuracy of second predetermined number of bits,
    wherein said second predetermined number is larger than said first predetermined number.

2. An A/D converter system according to claim 1, wherein said time constant circuit having a resistor and a capacitor provided at input of said A/D converter element, so that said input analog signal is applied to the A/D converter element through said resistor and said slope potential is applied to the A/D converter element through said capacitor.

3. An A/D converter system according to claim 1, wherein first predetermined number is 8, said second predetermined number is 10, and calculator provides an average of 16 digital output signals of said A/D converter element.

4. An A/D converter system according to claim 1, wherein said linear potential means has at least one integrator which receives a rectangular pulse signal.

5. An A/D converter system according to claim 4, wherein said rectangular pulse signal has duty ratio of 50%.

6. An A/D converter system according to claim 1, wherein said addition means adds an output of said linear potential means to reference level of said A/D converter element.

7. An A/D converter system according to claim 1, wherein said addition means adds an output of said linear potential means to an input analog signal.

* * * * *